United States Patent [19]

Bernacki

[11] 4,119,855
[45] Oct. 10, 1978

[54] NON VACUUM SOFT X-RAY LITHOGRAPHIC SOURCE

[75] Inventor: Stephen E. Bernacki, Worcester, Mass.

[73] Assignee: Massachusetts Institute of Technology, Cambridge, Mass.

[21] Appl. No.: 813,934

[22] Filed: Jul. 8, 1977

[51] Int. Cl.² .................................. G03B 41/16
[52] U.S. Cl. ....................... 250/402; 250/492 R; 250/493
[58] Field of Search ........... 250/399, 401, 402, 492 R, 250/492 A, 493, 505; 313/55

[56] References Cited

U.S. PATENT DOCUMENTS

| 3,602,686 | 8/1971 | Lempert | 250/399 |
| 3,852,596 | 12/1974 | Houtman | 250/399 |
| 3,870,882 | 3/1975 | Larson | 250/493 |

Primary Examiner—Craig E. Church
Attorney, Agent, or Firm—Arthur A. Smith, Jr.; Martin M. Santa

[57] ABSTRACT

A source of electrons or charged particles is contained in a baffled enclosure at less than atmospheric pressure. The source projects the electrons or charged particles to strike a target with a velocity which generates soft x-rays. The target is in a chamber at substantially atmospheric pressure in a gaseous environment which is only slightly dispersive and absorptive of the soft x-rays. Access to this chamber is provided to insert a mask and substrate for lithographing by the soft x-rays.

7 Claims, 2 Drawing Figures

NON VACUUM SOFT X-RAY LITHOGRAPHIC SOURCE

The Government has rights in this invention pursuant to Contract No. AF19(628)-76-C-0002 awarded by the Department of the Air Force, Electronic Systems Division.

FIELD OF INVENTION

This invention provides a source of soft x-rays and more particularly to a source for use in x-ray lithography, a technique for replicating patterns having submicron line widths.

BACKGROUND OF INVENTION

In the microelectronic industry the prior art method of pattern replication is by means of the photolithographic process in which light of 3000 to 4000 Å wavelength illuminates a photo sensitive polymer through a mask. The mask is usually constructed of clear glass with either chrome or dark emulsion patterns on it which are opaque to the light and therefore casts a shadow onto the photosensitive polymer. After exposure the polymer is subjected to a developer which removes either the exposed or unexposed areas to recreate the pattern (or its negative) of the mask. This technique has been widely used in the manufacture of microelectronic circuits because it is inexpensive and reliable and suitable for mass production. The process has the meritorious feature that it may be practiced in a cleanroom atmosphere. However, this procedure has not worked well when the width of the smallest discrete element of the pattern is less than about two microns, but to the diffraction of the light used.

In an attempt to overcome this difficulty, soft x-ray lithography, as described in U.S. Pat. No. 3,743,842, Smith et al, which uses x-rays of wavelength 5–50 Å greatly reduces the effects of diffraction. With this replication technique diffraction gratings with a periodicity of 3600 Å have been replicated demonstrating the high resolution capability of x-ray lithography.

One disadvantage of x-ray lithography, however, in the relatively long exposure times required for replication, typically 0.1 to 10 hours using existing x-ray sources and x-ray sensitive polymers. One method of shortening the exposure time necessary for x-ray lithography is to provide a more intense source of soft x-rays, inasmuch as the exposure time is inversely proportional to the intensity of the x-ray source.

SUMMARY OF THE INVENTION

It is therefore an object of this invention to provide a source of soft x-ray lithography.

It is a further object of this invention to provide such a source of soft x-rays in a helium or hydrogen environment at a pressure of one atmosphere, precluding the necessity to expose pieces of work to soft x-rays in a vacuum environment.

It is a factor of this invention to provide such an x-ray source in an environment at atmospheric pressure precluding the necessity for x-ray vacuum windows which attenuate the x-ray intensity which increases exposure time.

These objects and features achieved in the present invention by producing an electron beam in a vacuum environment to strike a target at a velocity which produces soft x-rays. The target and resulting x-rays are in an open-ended enclosure having an atmosphere of hydrogen or helium at slightly greater than atmospheric pressure. When the enclosure has its open end lower than the closed end of the enclosure, the hydrogen or helium gases displace the air and thereby provides gaseous environment in which the electron beam is not greatly scattered as when the heavier molecules in the air are present and the degree of vacuum required by the electron gun is reduced, and the absorption of the soft x-rays is reduced even though operation is at atmospheric pressure. The soft x-ray sensitive material is placed in the helium or hydrogen gas within the enclosure.

IN THE FIGURES

PREFERRED EMBODIMENT

Figure 1:
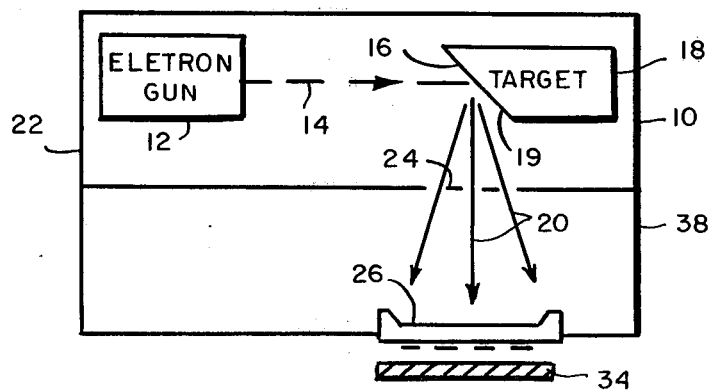
FIG. 1 shows a prior-art embodiment of apparatus for soft x-ray lithography.

For the purpose of x-ray lithography as disclosed in U.S. Pat. No. 3,743,842, Smith et al, the prior-art soft x-ray source is shown in FIG. 1. The soft x-ray source 10 is comprised of an electron gun 12, typically a heated tungsten filament to supply electrons and a voltage acceleration system, to form the electrons into a beam 14 which impinges upon a spot 16 on target 18 in an enclosure 22. This spot 16, typically with an area of 1 square millimeter, is the source of soft x-rays 19.

In this prior art embodiment, the soft x-ray source 10 must be enclosed in a vacuum of $10^{-9}$ atmospheres and can be used in either of three configurations. The first configuration as shown in FIG. 1 uses a vacuum window 24, typically a one thousandths of an inch thick foil of beryllium or a three tenthousandths of an inch thick membrane of silicon which will withstand atmospheric pressure in chamber 38 and maintain a vacuum in the soft x-ray source 10 enclosure 22. This configuration has the disadvantage that the x-rays 19 must pass through the window 24 and are thereby attenuated so that the intensity of the x-ray flux 20 is only 50% or less of the intensity of x-ray flux 19, thereby increasing exposure time.

The second configuration (not shown) is to omit the vacuum window 24 and to maintain chamber 38 at $10^{-9}$ atmospheres. In this configuration an additional vacuum of $10^{-2}$ atmosphere is required on the other side of mask 26 which forms a part of the wall of chamber 38 to prevent its warping or bulging.

The third configuration is to place the entire x-ray mask 26 and substrate 34 inside the chamber 38 in the vacuum. The disadvantage of the second and third configurations is that chamber 38 has to be brought up to atmosphere every time the substrates 34 are changed and then brought down to vacuum again for exposure. This pumpdown time is undesirable from an economics viewpoint since it prevents high volume production. The present invention has the advantage that the x-ray source is located in a region of atmospheric pressure so that x-ray exposure samples 34 can be changed rapidly with no pumpdown time and so that a vacuum window 24 is not necessary alleviating all of the disadvantages of the three configurations of the prior art soft x-ray sources.

The present invention consists of an electron beam source 48, consisting of an electron gun 50, typically a heated tungsten filament or tungsten rod supplying electrons and an acceleration system to form the electrons into a beam 52. The gun 50 is within an enclosure 54 which is pumped to a vacuum of at least $10^{-6}$ atmospheres by vacuum pump 56. The beam of electrons 52 passes through a small orifice 58 in enclosure 54 and strikes the electrically grounded x-ray target 60 in a small spot 61 creating a flux of x-rays 62. The x-ray target 60 typically water cooled and possibly rotating, is placed at the closed upper end of an open-ended enclosure 64 which contains one atmosphere of either hydrogen or helium, supplied by a small flow of gas through input 66 gas from source 67. The x-ray flux 62 is then used for x-ray lithography, exposing a resist coated substrate 68 through an x-ray mask 70.

Helium is the preferred gas in enclosure 64 because its relatively small electron scattering cross section minimizes the spreading out of the electron beam 52 after it exits the orifice 58 thereby keeping the x-ray source spot 61 small, typically 1 square millimeter. Helium is preferred also because the soft x-ray attenuation coefficient of helium is small and will attenuate the x-ray beam 62 less than one percent for a typical distance from the spot 61 to the x-ray mask 70.

Figure 2:
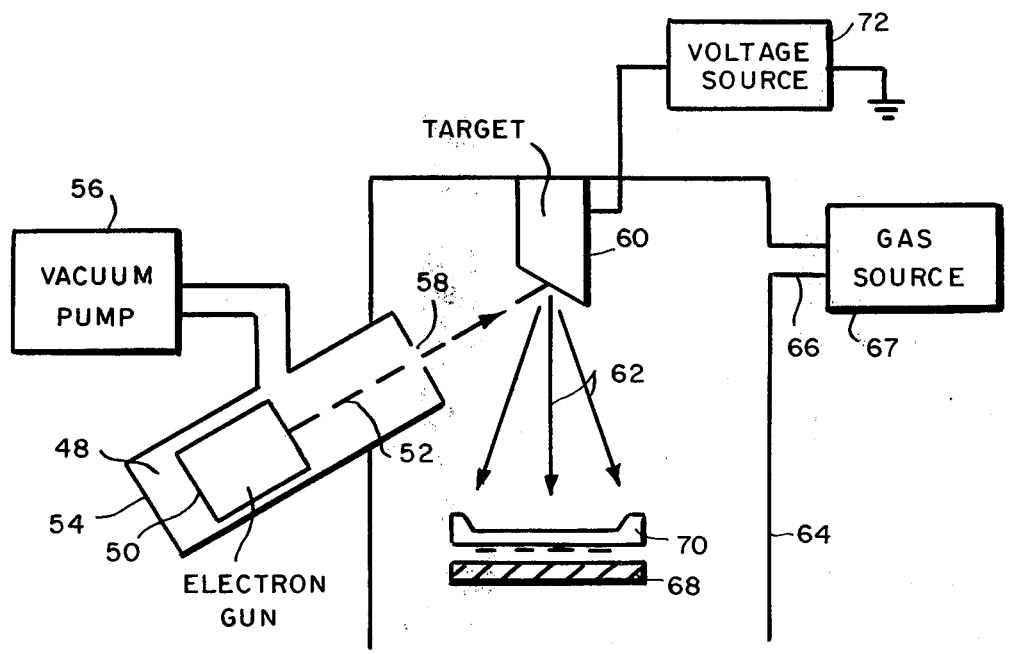
FIG. 2 shows a preferred embodiment of the apparatus of this invention.

Also, since both hydrogen and helium are less dense than air, the exposure chamber 64 can be open at the bottom as illustrated in FIG. 2. This allows rapid changeover of x-ray lithography substrates 68 and masks 70 and x-ray target materials 60.

The type of electron source configuration 48 is similar to non-vacuum electron beam sources developed for the purpose of non-vacuum electron beam welding and electron beam excavation, as shown in U.S. Pat. Nos. 3,725,633, Schumacher, et al and 2,899,566, Schumacher, et al. However, the existing electron beam sources generally produce a beam of electrons with 100 keV to 150 KeV of energy which are unsuitable for soft x-ray lithography. Electron beams of these energies will produce high energy, short wavelength, so called hard x-rays which are very penetrating, and therefore, cannot be efficiently masked by x-ray masks of submicron dimensions. Indeed, x-rays produced by electron beams of such high energy are so penetrating that they present a health hazard to the operator necessitating the use of properly designed lead shielding.

The fundamental physical reason of the high energy of the x-rays is the high energy of the electrons 52 as they strike the atoms of the x-ray target 60 in spot 61. There are two solutions claimed here to the aforementioned problems of high energy x-rays.

The first solution is to use an electron gun 50 which produces electrons with an energy of around 50 keV. Such a gun would be similar to those used for non-vacuum electron beam welding with the exception of modified electron optics so as to focus the electron beam of 52 of lower energy into a spot 61 on the surface of the electrically grounded x-ray target 60. In this first solution the distance between the exit orifice 58 and the surface of the x-ray target 61 must be minimized because the cross-section of the electron beam 52 (and hence the size of the spot 61) tends to increase as the distance from the exit orifice is increased due to electron scattering from the molecules of the enclosed gaseous atmosphere. This phenomenon, however, can be minimized by using electron beams of higher energy, which leads to the second solution.

The second solution to the problems of high energy x-rays is to use a high energy electron gun of 100 keV to 150 keV and to lower the electrical potential of the x-ray target 60 by 50 keV or 100 keV, respectively, by means of a voltage source 72. In this configuration that part of the electron energy amounting to the target potential subtracted from the electron beam voltage will be transferred to the electric field surrounding the x-ray target before the electrons strike the target. For example, 150 keV electron beam focussed and directed onto an x-ray target which is at a potential of $-100$ kilo volts will produce a source of soft x-rays equivalent to a source produced by 50 keV electrons striking a target at ground potential. The advantage of this second solution is that a high energy electron beam suffers less broadening due to molecular collisions that does a lower energy electron beam, resulting in a smaller spot size 61. In effect, a small diameter high energy electron beam is used to transport the electrons to the vicinity of the soft x-ray target where it begins to interact with the electric field produced by the target potential. Then the momentum of electron beam tends to maintain a small cross-section as the beam loses energy to the electric field until the electrons strike the atoms of the target at reduced energy.

It should be mentioned that in addition to using a beam of electrons 52 to excite the source of x-rays 61, beams of other particles may also be used, as it is known that the bombardment of a target by particles other electrons will also create a source of x-rays. In this embodiment, the electron gun 50 may be removed and replaced by an ion beam gun consisting, for example, or a ion gun source and one or more electrostatic accelerating lenses, of the type currently well known and used to create ion beams for use in ion beam implantation and micro-analysis.

The target 60 may be any material that is suitable for soft x-ray generation. Typical of those materials are copper, aluminum, silicon, and carbon.

It is evident that those skilled in the art, once given the benefit of the foregoing disclosure, may now make numerous other uses and modifications of, and departures from the specific embodiments described herein without departing from the inventive concepts. Consequently, the invention is to be construed as embracing each and every novel feature and novel combination of features present in, or possessed by, the apparatus and techniques herein disclosed and limited solely by the scope and spirit of the appended claims.

What is claimed is:

1. A soft x-ray source comprising:
   a source of beam of charged particles having a velocity,
   a first enclosure containing said source,
   said first enclosure having an exit port aligned with said beam to allow said particles to exit the first enclosure,
   a vacuum pumping system connected to said first enclosure to reduce the pressure in said first enclosure to a pressure which does not substantially scatter the particles,
   a second enclosure,
   a target in said second enclosure,
   the exit port of said first enclosure being within said second enclosure,
   said beam of particles exiting from said first enclosure through said exit port to enter said second enclosure and strike said target at a velocity to produce soft x-rays,
   a source of gas,
   an entrance port to said second enclosure connected to said gas source to provide gas in excess of atmospheric pressure to fill said second enclosure with said gas, means for inserting material into said second enclosure, whereby soft x-ray produced at said target pass through said gas to said material.

2. The soft x-ray source of claim 1 wherein:
said charged particles are electrons.

3. The soft x-ray source of claim 2 wherein:
said second chamber has an opening to the atmosphere at its bottom and is closed at its top, and
said gas is helium.

4. The soft x-ray source of claim 2 wherein:
said second chamber has an opening to the atmosphere at its bottom and is closed at its top, and said gas is hydrogen.

5. The soft x-ray source of claim 2 wherein:
said source produces said electrons at a velocity which is greater than that which will produce soft x-rays,
means for maintaining said target at a voltage which reduces the velocity of the electrons to that which will produce soft x-rays.

6. The apparatus of claim 3 wherein the vacuum pump produces a pressure of at least $10^{-6}$ atmosphere in said first chamber.

7. The apparatus of claim 4 wherein the vacuum pump produces a pressure of at least $10^{-6}$ atmosphere in said first chamber.

* * * * *